US009958847B2

(12) United States Patent
Mercado et al.

(10) Patent No.: US 9,958,847 B2
(45) Date of Patent: May 1, 2018

(54) UNIVERSAL BOX BUILD

(71) Applicant: Flextronics AP, LLC, Broomfield, CO (US)

(72) Inventors: Raymundo Alatorre Mercado, Campbell, CA (US); Murad Kurwa, San Jose, CA (US); Gervasio Mutarelli, Livermore, CA (US); Xiuchuan Wang, Campbell, CA (US)

(73) Assignee: Flextronics AP, LLC, San Jose, CA (US)

(*) Notice: Subject to any disclaimer, the term of this patent is extended or adjusted under 35 U.S.C. 154(b) by 491 days.

(21) Appl. No.: 14/666,470

(22) Filed: Mar. 24, 2015

(65) Prior Publication Data

US 2016/0286663 A1    Sep. 29, 2016

(51) Int. Cl.
*G05B 19/00* (2006.01)
*H05K 3/00* (2006.01)
*B25J 15/04* (2006.01)

(52) U.S. Cl.
CPC .............. *G05B 19/00* (2013.01); *B25J 15/04* (2013.01); *H05K 3/0005* (2013.01); *H05K 3/0008* (2013.01)

(58) Field of Classification Search
CPC .... H05K 3/0005; H05K 3/0008; G05B 19/00; B25J 11/00; B25J 15/04; Y10T 29/53013; Y10T 29/53174
See application file for complete search history.

(56) References Cited

U.S. PATENT DOCUMENTS

2013/0015596 A1* 1/2013 Mozeika ............... B25J 9/0084
                                                                  264/40.1
2014/0196879 A1* 7/2014 Cheung ..................... F28F 7/00
                                                                   165/185

* cited by examiner

*Primary Examiner* — Peter DungBa Vo
*Assistant Examiner* — Jeffrey Carley
(74) *Attorney, Agent, or Firm* — Volpe and Koenig, P.C.

(57) ABSTRACT

A method and apparatus for generating consumer electronics using a Universal Box Build (UBB) are disclosed herein. The method may include entering specifications of a product comprised of a printed circuit board (PCB), additional components (such as Central Processing Units (CPUs), memory modules, and heatsinks) into a chassis module, inserting a set of required components in the UBB, and generating the PCB assembly based on the entered specifications, wherein a robot is operatively connected to the interface module to automatically generate a product assembly.

14 Claims, 12 Drawing Sheets

UNIVERSAL BOX BUILD

FIELD OF INVENTION

Figure 1:
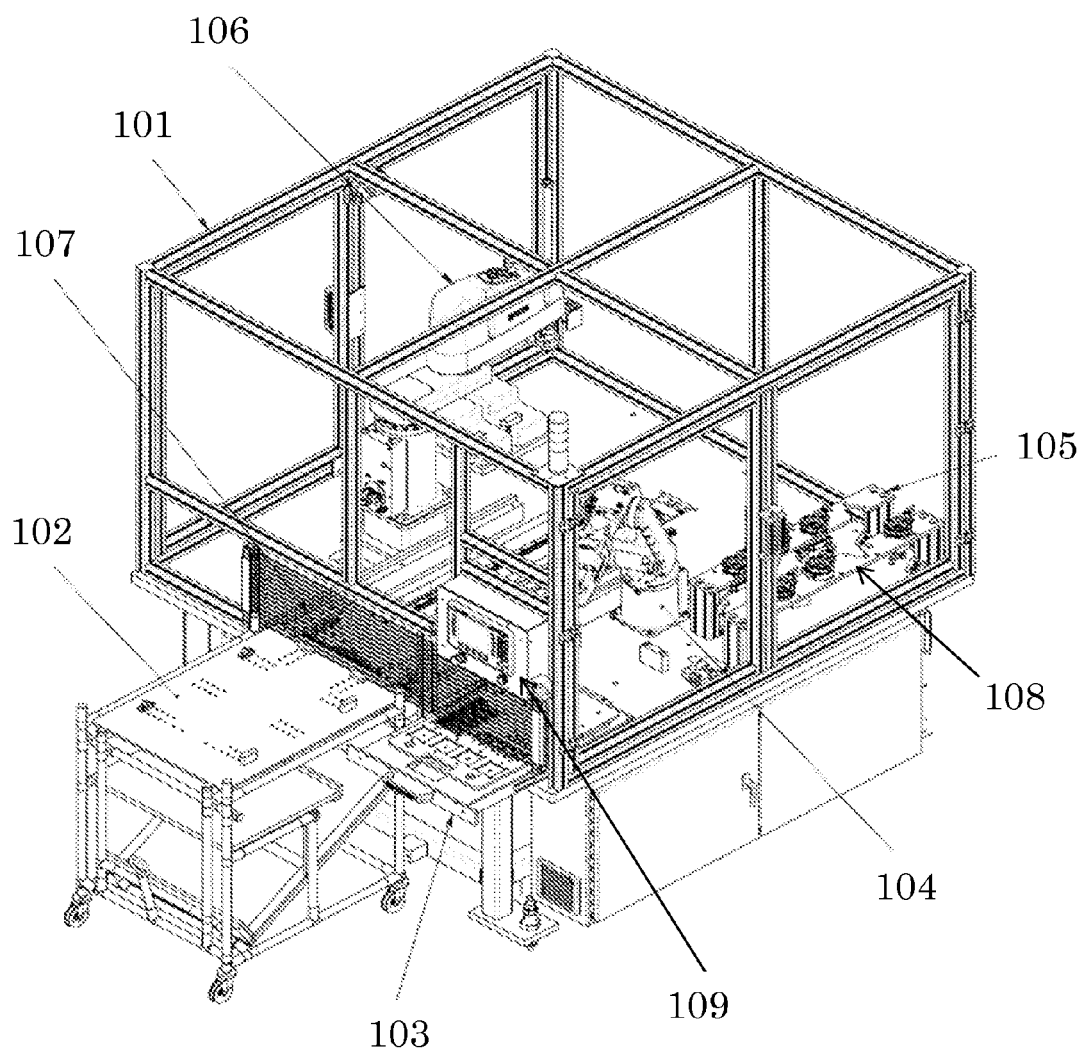

This application is in the field of electronics.

BACKGROUND

In the market, there are various consumer electronics devices with different brands. Each brand may have a different number of components to assemble a server or a different way of arranging similar components. Each server may have different specifications as well. Most devices are created manually with the help of tools. Some devices are created using automated systems, but these are used for a specific consumer product only.

Currently there is no universally generic approach to the current automated systems. There exists is a need for a universal system that includes the tooling required to program positions, datum, and fiducials on consumer electronic devices and assemble them with a low changeover time between specifications.

SUMMARY

A method and apparatus for generating consumer electronics using a Universal Box Build (UBB) herein. The method may include entering specifications of a product comprised of a printed circuit board (PCB), additional components, such as Central Processing Units (CPUs), memory modules, and heatsinks into a chassis, inserting a set of components required into the UBB, and generating the PCB based assembly on the entered specifications, wherein a robot is operatively connected to the interface module to automatically generate the product assembly.

BRIEF DESCRIPTION OF THE DRAWING(S)

Figure 2:
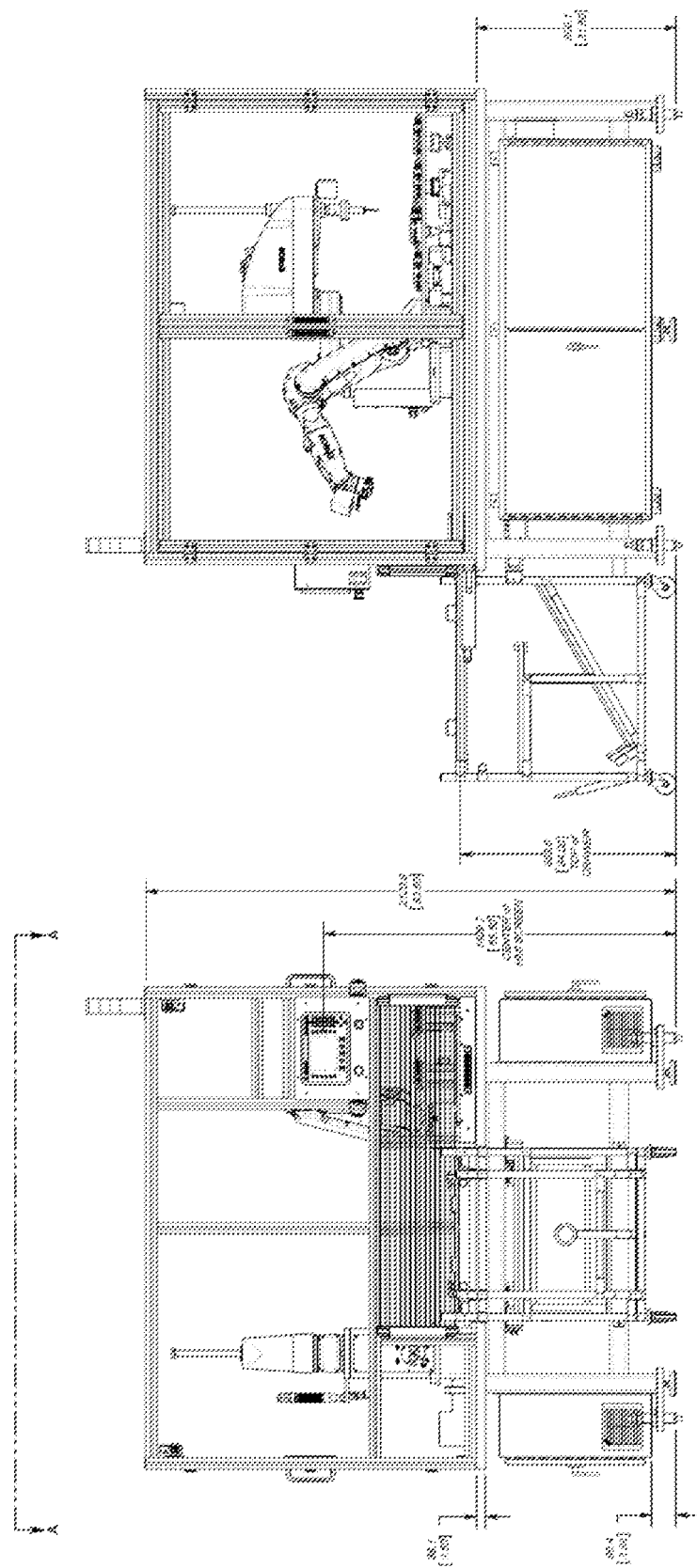
Figure 3:
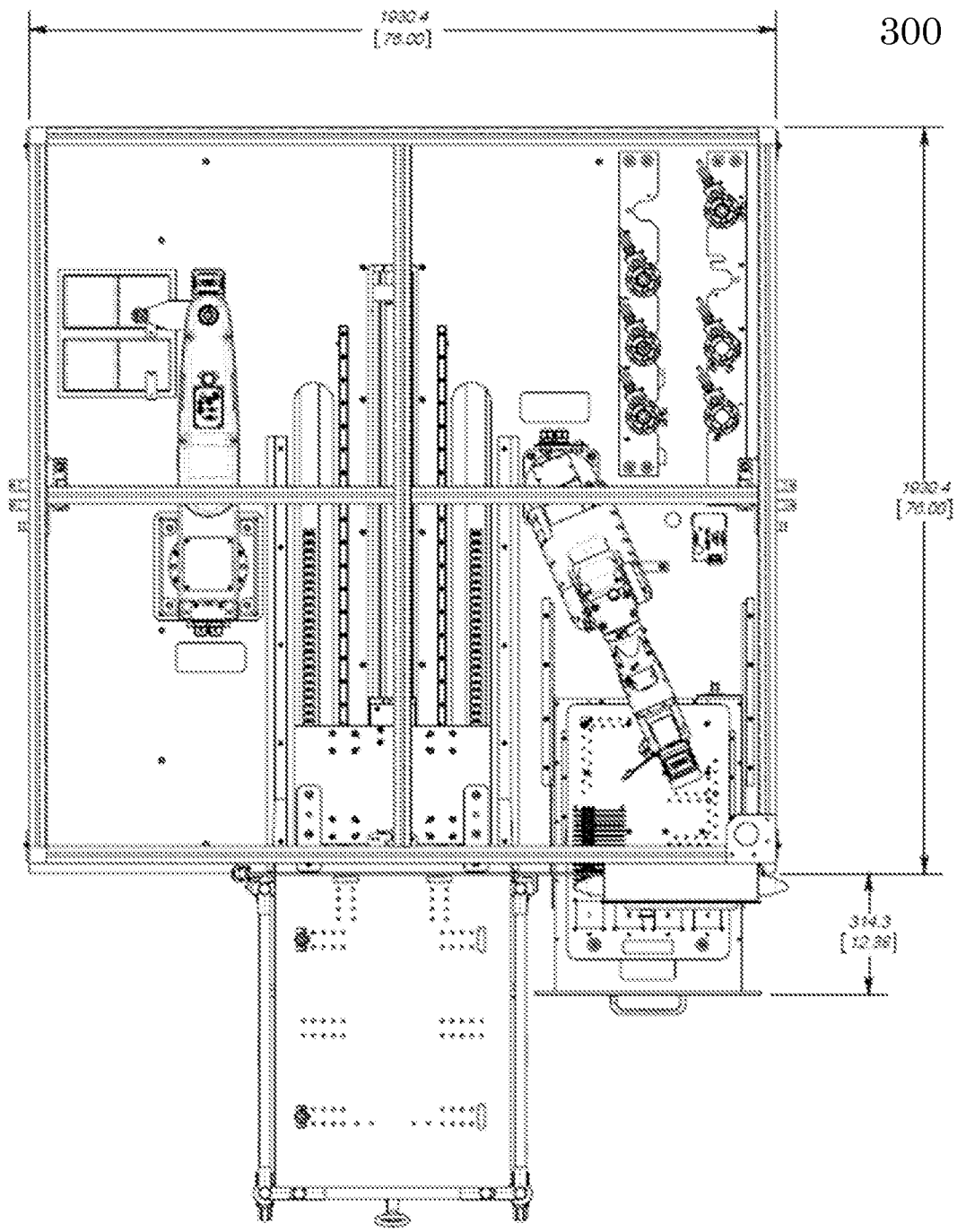
Figure 4:
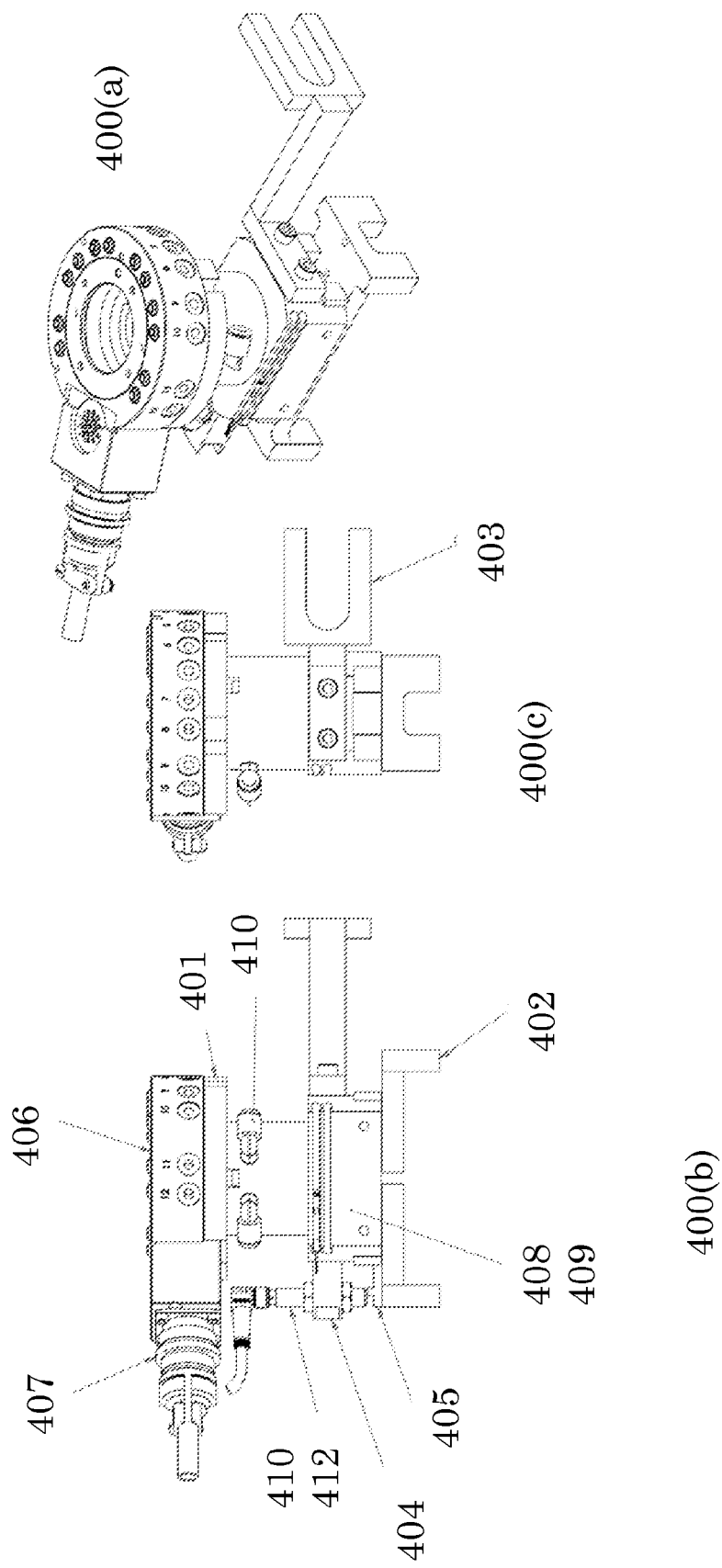
Figure 5:
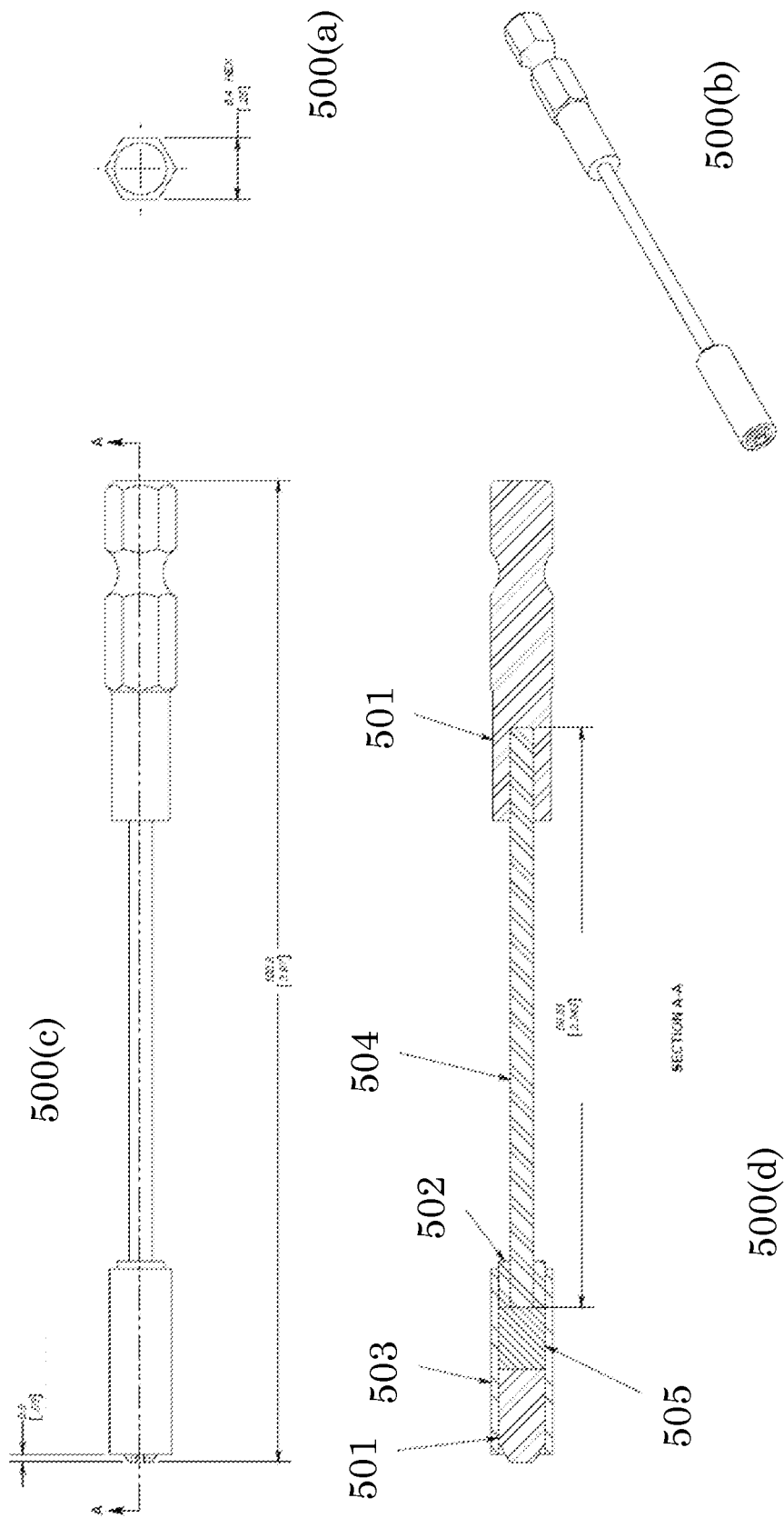
Figure 6:
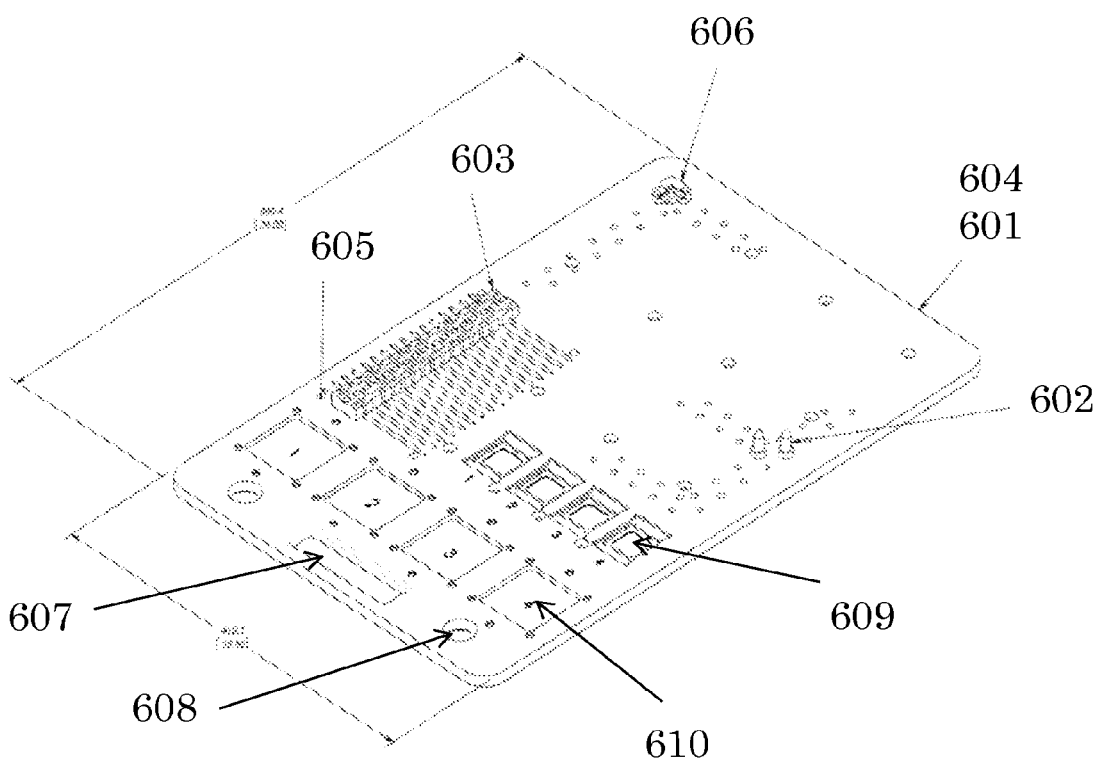
Figure 7:
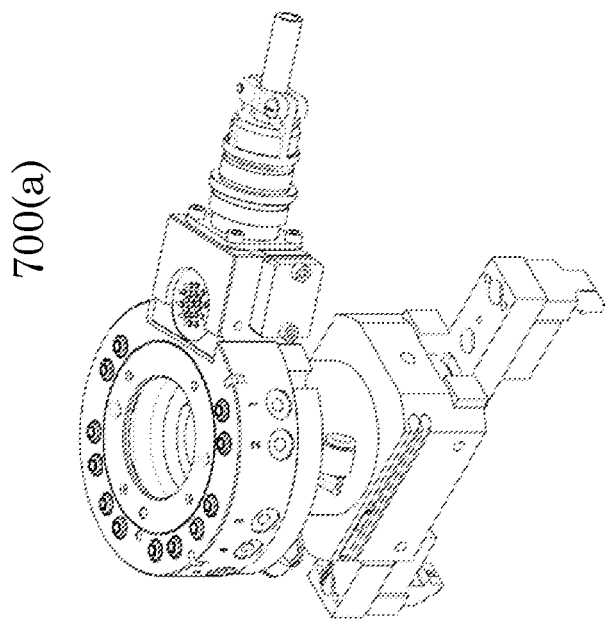
Figure 7:
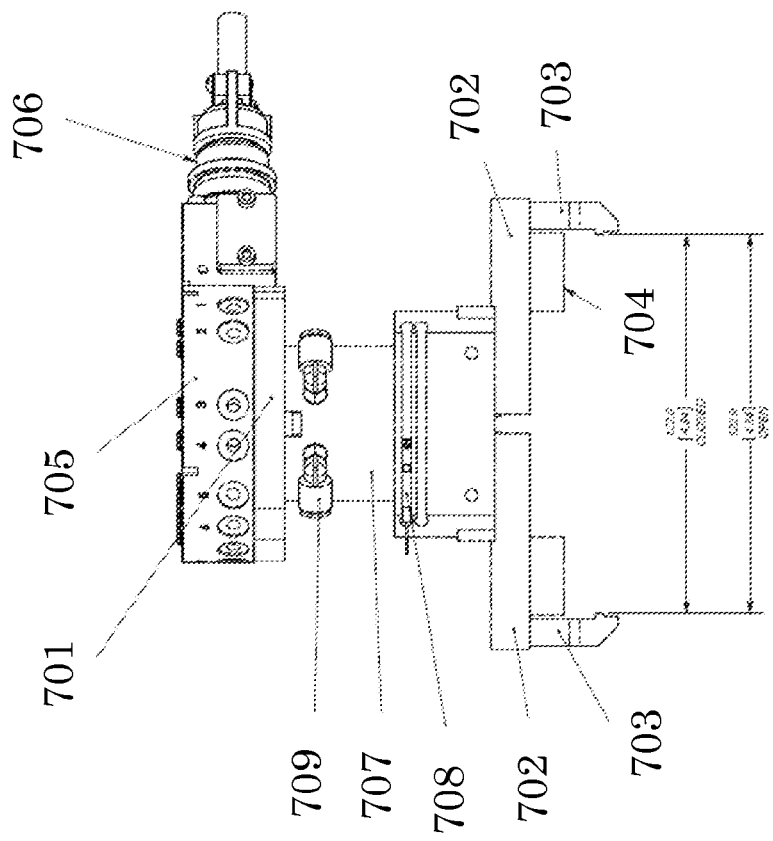
Figure 8:
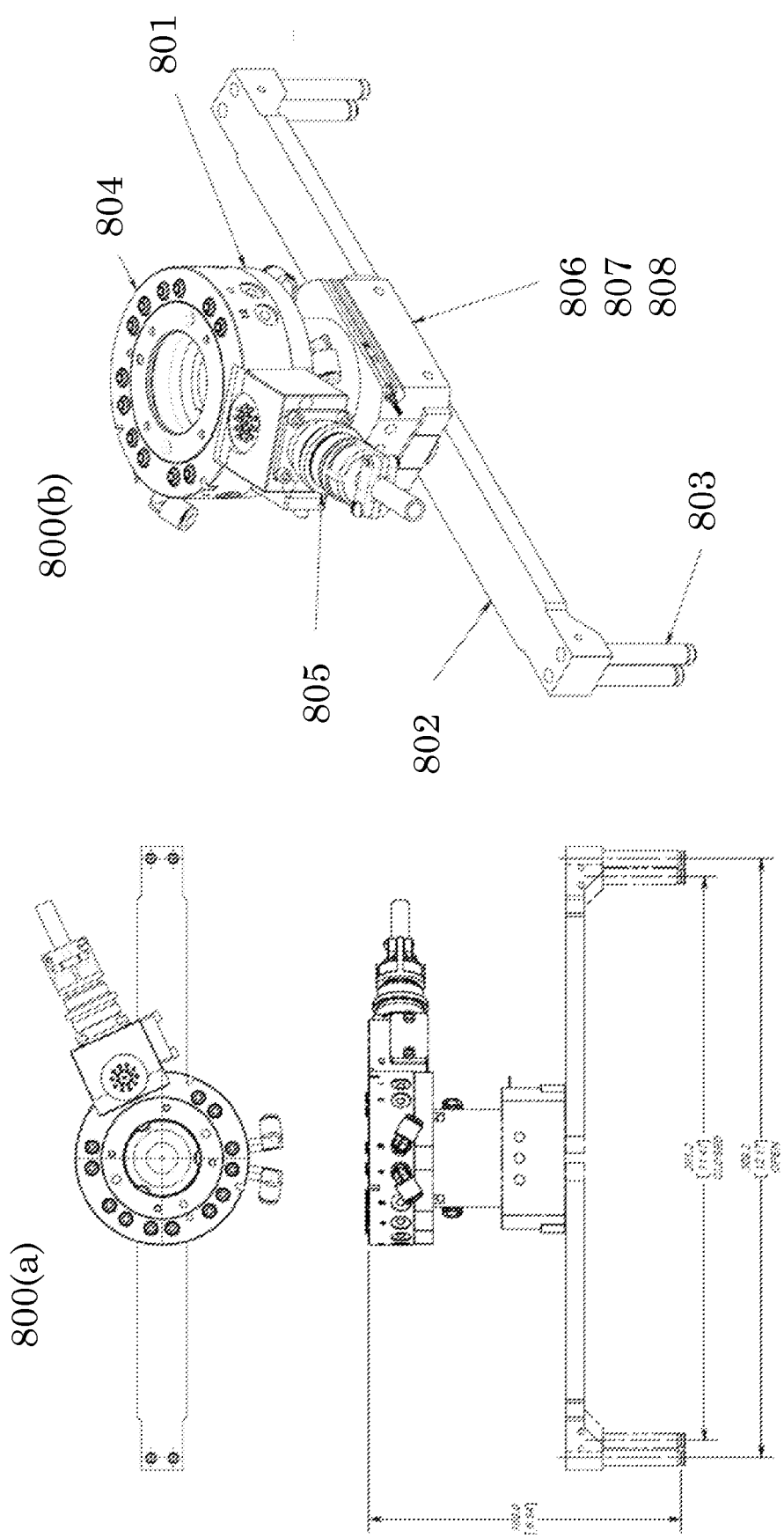
Figure 9:
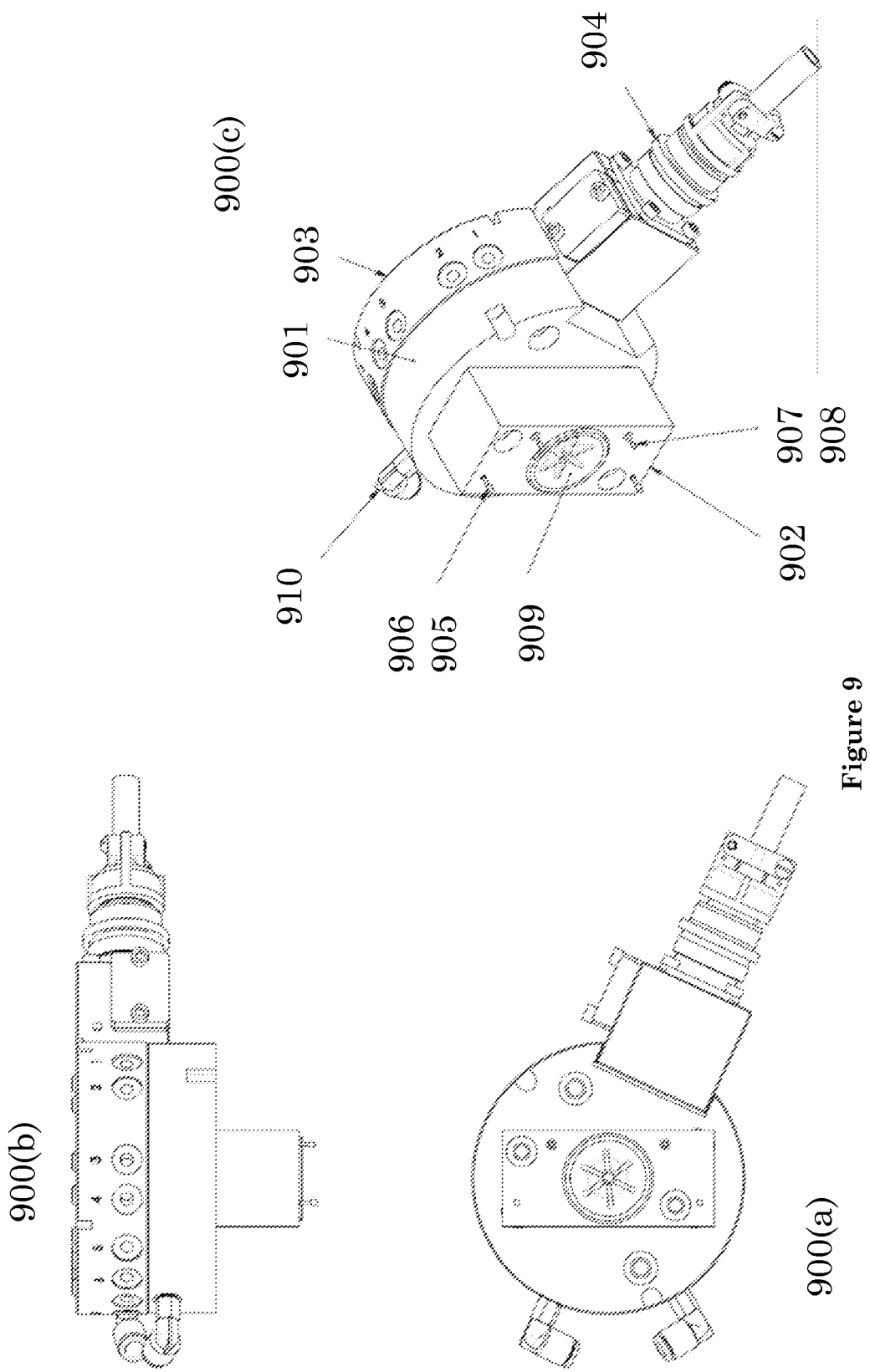
Figure 10:
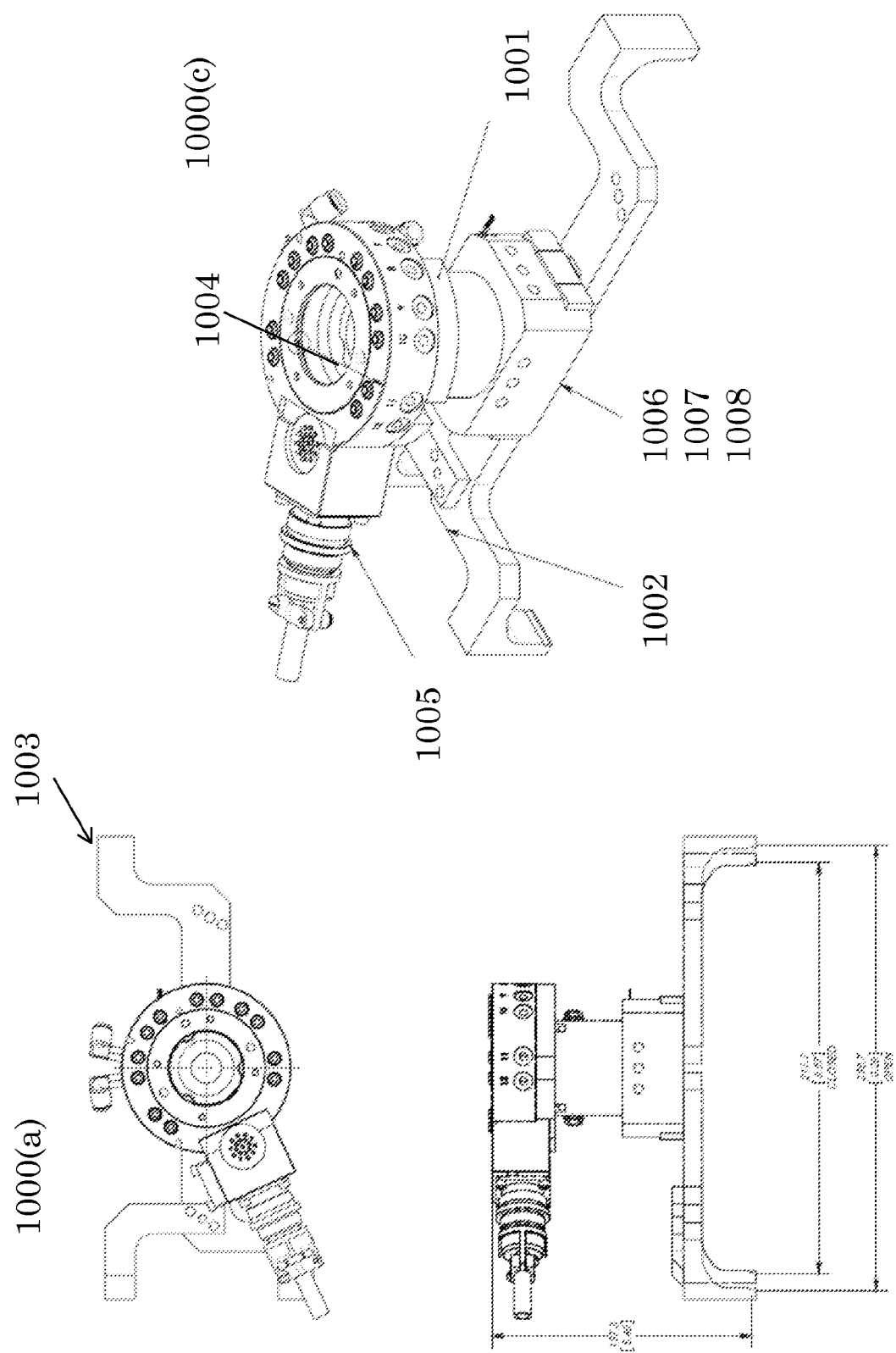
Figure 11:
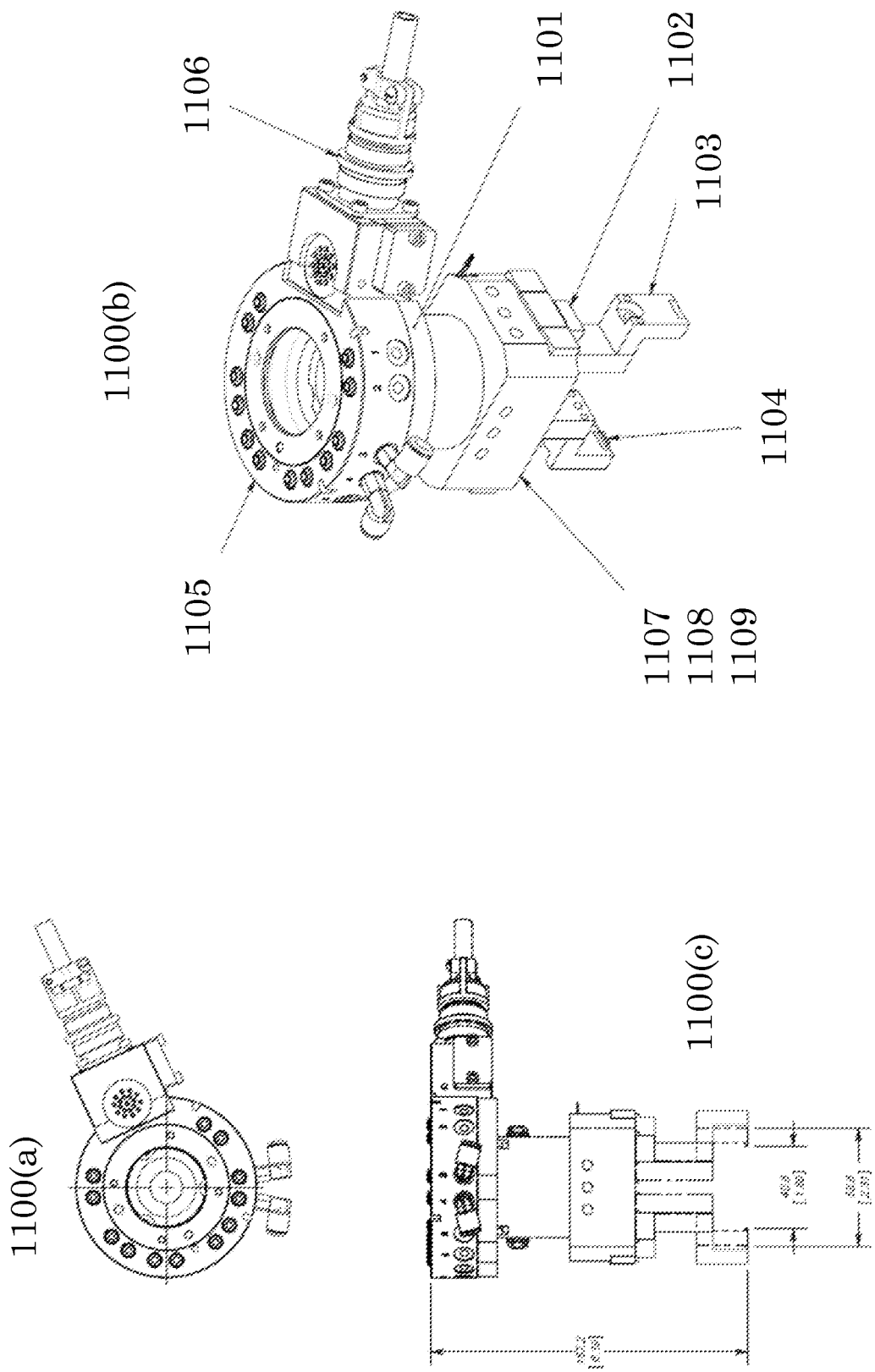
Figure 12:
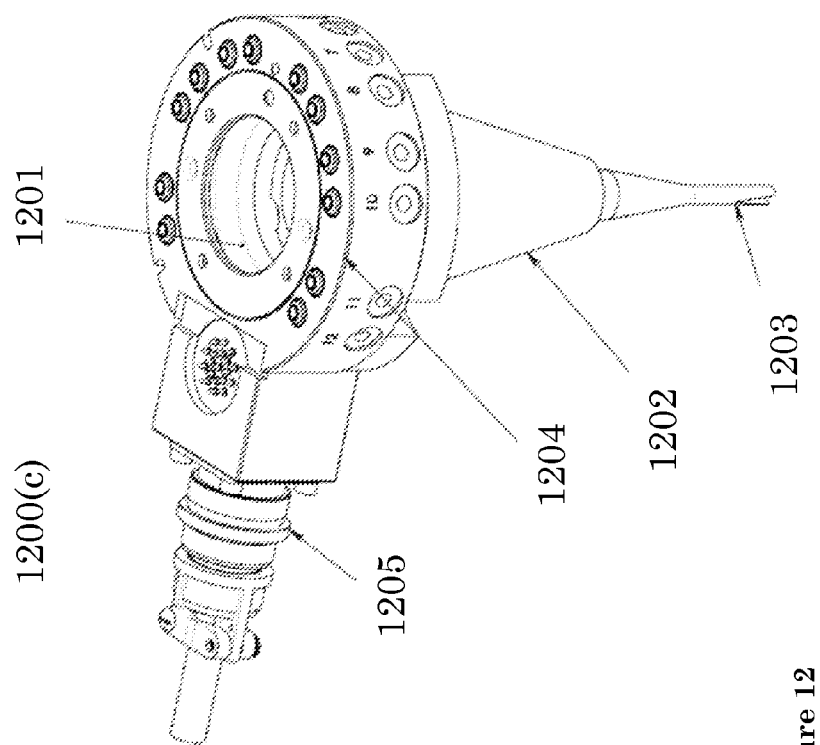
Figure 12:
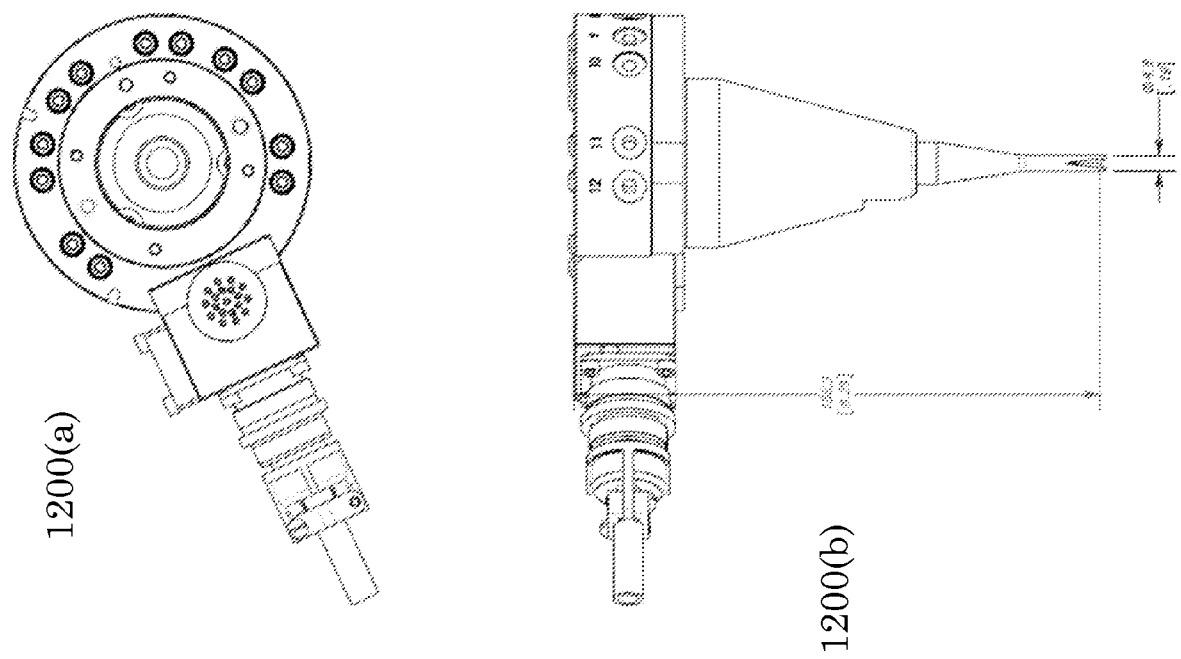

FIG. 1 is an example of a Universal Box Build (UBB);
FIG. 2 is an example of a front view and a side view of the UBB;
FIG. 3 is a top view of the UBB;
FIG. 4 is an example of a heatsink gripper;
FIG. 5 is an example of an inertia resistant screw bit;
FIG. 6 is an example of a kitting tray;
FIG. 7 is an example of a memory modules gripper;
FIG. 8 is an example of an ODM MB gripper;
FIG. 9 is an example of a CPU gripper;
FIG. 10 is an example of a MB gripper;
FIG. 11 is an example of a CPU cover gripper; and
FIG. 12 is an example of a CPU socket latch handling tool.

DETAILED DESCRIPTION OF THE PREFERRED EMBODIMENT(S)

It is to be understood that the figures and descriptions of embodiments of a Universal Box Build (UBB) have been simplified to illustrate elements that are relevant for a clear understanding, while eliminating, for the purpose of clarity, many other elements found in typical vehicle systems. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to system and method of activating or triggering predetermined functions for vehicle electromechanical systems based on image recognition and radio frequency systems. Other electronic devices, modules and applications may also be used in view of these teachings without deviating from the spirit or scope as described herein. The UBB may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the UBB although it may be described with respect to a particular embodiment.

A Universal Box Build (UBB) may be used to create consumer electronic devices for multiple brands including tools to program positions, datum, and fiducials and assemble the devices with low changeover time specifications. The UBB may have full traceability and data recording using various sensors, (for example, torque on screws, force applied when placing the components, deflection on a printed circuit board (PCB) main board, force when a memory module is inserted, a parts presence indicator, and a machine vision to record the incoming components state) while also using the their characteristics for handling to address the variability of off the shelve parts. Recorded data and images for quality validation and traceability may be transmitted to a Manufacturing Execution System (MES) making the cell Internet of Things (IoT) ready.

The end effectors and work flow of the cell may be designed to accommodate several standards of components with the universal function train of thought from the group up. Adaptability to several standard components has been accomplished with adjustable gripping tools. Precise positioning is done with respect to fixed fiducials from the manufacturing of the components and characteristics. For traceability, all of the measurements and quality assurance data may be connected to the MES system, making the cell IOT ready.

FIG. 1 is an example of a Universal Box Build (UBB). The UBB 100 includes a box 101, a rolling cart 102, a kitting tray 103, a robot 104, a tool changer 105, a robotized screw tool 106, a gate 107, an end of arm tool box 108, and a human interface module 109. The tool box 108 may include a heatsink gripper, an inertia resistant screw bit, a memory modules gripper, an ODM MB gripper, a CPU gripper, a MB gripper, a CPU cover gripper, and a CPU socket latch. Each one of these tools may attach to the tool changer to add a specific piece, for example a heatsink, a CPU, a memory module, and the like, to the PCB. This interchangeability may allow the UBB to perform the necessary functions of assembling to the PCB after a user input of the required specifications.

The user may input the specifications of the PCB into the human module interface. The computer may then respond by bringing in the product chassis from the rolling cart 102 into the UBB 101. The UBB may then assemble onto the PCB based on the specifications inputted by the user the quantities of components from the kitting tray. The robot 104 is a robotic arm that engages the tool changer 105 to pick up the necessary tool from the tool box 108. Once the robot 104 has the necessary tool, it moves to the kitting tray 103 to obtain the PCB that will be assembled to the chassis. The robot 104 picks up the necessary piece and places it on the PCB. The screw tool 106 then attaches the necessary piece(s) to the PCB. Once all of the pieces are attached to the PCB based on the inputted specifications, the rolling cart 102 slides out from the UBB to allow the user to obtain the finished product.

FIGS. 2 and 3 show the UBB from different angles. FIG. 2 is an example of a front view 200(*a*) and a side view 200(*b*) of the UBB. Figure. FIG. 3 is a top view 300 of the UBB.

FIG. 4 is an example of the heatsink gripper. The heatsink gripper may be used to grab, install, and hold on position a generic heat sink. The heatsink gripper in FIG. 4 is shown from three angles, a top view 400(*a*), a side view 400(*b*), and a rear view 400(*c*). The side view 400(*b*) illustrates the various elements of the heatsink gripper. The heatsink gripper may include a tool changer adaptor 401, a heatsink gripper finger 402, a prox mount 404, a prox flag 405, a QC-20 tool 406, a connector 407, a jaw gripper 408, an auto switch 409, an elbow fitting 410, a prox switch 411, a cordset 412, and a sock cap screw 413. The rear view 400(*c*) of the heatsink gripper illustrates the heatsink support 403.

FIG. 5 is an example of an inertia resistant screw bit. The inertia resistant screw bit, used on fast moving tools, may help with inertia issues when moving slim screw bits at full speed on a robot to have a precise tip location. The inertia resistant screw bit in FIG. 5 is shown from several angles: a rear angle 500(*a*), a top view 500(*b*), and a side view 500(*c*). The side view 500(*c*) of the inertia resistant screw bit, when cut along the A' line 510, results in the image shown in 500(*d*). The inertia resistant screw bit may include a Phillips bit 501, a bushing 502, a screw centering sleeve 503, a dowel pin 504, and a cylinder magnet 505.

FIG. 6 is an example of a kitting tray. The kitting tray 604 may include reinforcement (underneath) 601, PCB supports 602, memory module support 603, memory module slots 605, PCB reference corner 606, an operator handle 607, position lockdown holes 608, CPU holders 609, and heatsink holders 610. The kitting tray 604 may be used to hold the components and aid in controlling the pick-up of these components through precise location or machine vision location. The kitting tray 604 may include several spaces to accommodate several families of server components. The spaces may be filled with the required components. The components may be handled through a recipe system on the human module interface. The kitting tray 604 has a poka-yoke, or mistake-proof, design to avoid any errors when placing components.

FIG. 7 is an example of a memory modules gripper. The memory modules gripper may be used to pick up and insert RAM memory modules while safely addressing the quality and avoiding any damage to the module. The memory modules gripper in FIG. 7 is shown from two angles, a top view 700(*a*) and a side view 700(*b*). The side view 700(*b*) illustrates the various elements of the memory modules gripper. The memory modules gripper may include a tool changer adaptor 701, a finger adaptor 702, a gripper finger 703, a module block 704, a QC-20 tool 705, a connector 706, a jaw gripper 707, an auto switch 708, and an elbow fitting 709.

FIG. 8 is an example of an ODM MB gripper. The ODM MB gripper in FIG. 8 is shown from three angles, a top view 800(*a*), a side view 800(*b*), and a planar view 800(*c*). The side view 800(*b*) illustrates the various elements of the ODM MB gripper. The ODM MB gripper may include a tool changer adaptor 801, a MB gripper finger 802, a MB gripper pin 803, a QC-20 tool 804, a connector 805, a jaw gripper 806, an auto switch 807, and an elbow fitting 808.

FIG. 9 is an example of a CPU gripper. The CPU gripper in FIG. 9 is shown from three angles, a top view 900(*a*), a side view 900(*b*), and a bottom view 900(*c*). The bottom view 900(*c*) illustrates the various elements of the CPU gripper. The CPU gripper may include a tool changer adaptor 901, a spring pin block 902, a QC-20 tool 903, a connector 904, a first contact probe 905, a first receptacle 906, a second contact probe 907, a second receptacle 908, a vacuum chip 909, and an elbow fitting 910.

FIG. 10 is an example of a MB gripper. The MB gripper in FIG. 10 is shown from three angles, a top view 1000(*a*), a side view 1000(*b*), and a rear view 1000(*c*). The rear view 1000(*c*) illustrates the various elements of the citrix MB gripper. The citrix MB gripper may include a tool changer adaptor 1001, a citrix MB gripper finger 1002, a MB support finger 1003, a QC-20 tool 1004, a connector 1005, a jaw gripper 1006, an auto switch 1007, and an elbow fitting 1008.

FIG. 11 is an example of a CPU cover gripper. The CPU cover gripper in FIG. 11 is shown from three angles, a top view 1100(*a*), a side view 1100(*b*), and a rear view 1100(*c*). The side view 1100(*b*) illustrates the various elements of the CPU cover gripper. The CPU cover gripper may include a tool changer adaptor 1101, a CPU cover gripper arm 1102, a finger holder 1103, a cover gripper finger 1104, a QC-20 tool 1105, a connector 1106, a jaw gripper 1107, an auto switch 1108, and an elbow fitting 1109.

FIG. 12 is an example of a CPU socket latch handling tool. The CPU socket latch handling tool in FIG. 12 is shown from three angles, a top view 1200(*a*), a front view 1200(*b*), and a side view 1200(*c*). The side view 1200(*c*) illustrates the various elements of the CPU socket latch. The CPU socket latch may include a tool changer adaptor 1201, a latch tool adaptor 1202, a CPU latch tool 1203, a QC-20 tool 1204, and a connector 1205.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the systems described herein, and are considered to be within the full scope of the invention.

Although features and elements are described above in particular combinations, each feature or element can be used alone without the other features and elements or in various combinations with or without other features and elements.

What is claimed is:
1. A Universal Box Build (UBB) comprising:
an interface module;
a product chassis comprising a printed circuit board;
a kitting tray comprising a plurality of components;
a tool box comprising a plurality of tools, wherein each tool of the plurality of tools is configured to add a specific component of the plurality of components to the printed circuit board; a robot, wherein the robot comprises a robotic arm configured to pick up the plurality of tools, one tool at a time;
a tool changer configured to facilitate attachment of the plurality of tools to the robotic arm; and
a screw tool configured to attach the plurality of components to the printed circuit board; wherein
a user enters specifications of a product recipe into the interface module, and the robot is operatively connected to the interface module and configured to assemble a printed circuit according to the product recipe, wherein the product recipe includes instructions to:
  direct the robot to pick up a specific tool of the plurality of tools from the tool box,
  direct the robot to move to the kitting tray and pick up a specific component of the plurality of components that corresponds with the specific tool, and
  direct the robot to place the specific component on the printed circuit board such that the plurality of components are assembled onto a printed circuit board in series based on the entered specifications.

2. The UBB of claim 1, further comprising a rolling cart and at least one gate, wherein
  the product chassis and the printed circuit board are located on a top surface of the rolling cart at least prior to and following assembly of the plurality of components onto the printed circuit board.

3. The UBB of claim 1, wherein the product chassis is inserted into the UBB in an unpopulated state.

4. The UBB of claim 1, wherein the robot includes an end of arm tool that is used to assemble the product.

5. The UBB of claim 1, wherein the plurality of tools includes at least one of a heatsink gripper, an inertia resistant screw bit, a memory modules gripper, a central processing unit (CPU) gripper, a mother board (MB) gripper, an original design manufacturer (ODM) MB gripper, a CPU cover gripper, and a CPU socket latch.

6. The UBB of claim 1, wherein the plurality of components includes at least one of a heatsink, a CPU, a CPU cover, and a memory module.

7. The UBB of claim 1, wherein the screw tool attaches the specific component of the plurality of components to the printed circuit board.

8. The UBB of claim 1, wherein the kitting tray further comprises at least a reinforcement, printed circuit board supports, memory module support, memory module slots, a printed circuit board reference corner, an operator handle, position lockdown holes, CPU holders, and heatsink holders.

9. The UBB of claim 1, wherein the kitting tray comprises multiple spaces to accommodate multiple families of components.

10. The UBB of claim 5, wherein the heatsink gripper comprises at least a first tool changer adaptor, a first connector, a first jaw gripper, a first auto switch, a first elbow fitting, a prox switch, a cordset, and a sock cap screw.

11. The UBB of claim 5, wherein the inertia resistant screw bit comprises at least one of a first Phillips bit, a bushing, a screw centering sleeve, a dowel pin, and a cylinder magnet.

12. The UBB of claim 5, wherein the memory modules gripper comprises at least a second tool changer adaptor, a finger adaptor, a gripper finger, a module block, and a second elbow fitting.

13. The UBB of claim 5, wherein
  the ODM MB gripper comprises at least a third tool changer adaptor, a MB gripper finger, a MB gripper pin, a quick connect (QC-20) tool, a second connector, a second jaw gripper, a second auto switch, and a third elbow fitting, and
  the citrix MB gripper comprises at least a fourth tool changer adaptor, a citrix MB gripper finger, a MB support finger, a second QC-20 tool, a third connector, a third jaw gripper, a third auto switch, and a fourth elbow fitting.

14. The UBB of claim 5, wherein
  the CPU gripper comprises at least a fifth tool changer adaptor, a spring pin block, a third QC-20 tool, a fourth connector, a first contact probe, a first receptacle, second contact probe, a second receptacle, a vacuum chip, and a fifth elbow fitting,
  the CPU cover gripper comprises at least a sixth tool changer adaptor, a CPU cover gripper arm, a finger holder, a cover gripper finger, a fourth QC-20 tool, a fifth connector, a fourth jaw gripper, a fourth auto switch, and a sixth elbow fitting, and
  the CPU socket latch comprises at least a seventh tool changer adaptor, a latch tool adaptor, a CPU latch tool, a fifth QC-20 tool, and a sixth connector.

\* \* \* \* \*